United States Patent
Sun et al.

(10) Patent No.: US 7,250,569 B2
(45) Date of Patent: Jul. 31, 2007

(54) METHOD FOR DISSOLVING NANOSTRUCTURAL MATERIALS

(75) Inventors: Yi Sun, Woodside, NY (US); Stephen Wilson, Chatham, NJ (US)

(73) Assignee: New York University School of Medicine, New York, NY (US)

(*) Notice: Subject to any disclaimer, the term of this patent is extended or adjusted under 35 U.S.C. 154(b) by 247 days.

(21) Appl. No.: 10/132,387

(22) Filed: Apr. 26, 2002

(65) Prior Publication Data

US 2003/0001141 A1 Jan. 2, 2003

Related U.S. Application Data

(60) Provisional application No. 60/286,340, filed on Apr. 26, 2001.

(51) Int. Cl.
*D01F 9/12* (2006.01)
(52) U.S. Cl. ............ 136/252; 106/287.2; 106/287.21; 977/845; 423/447.2
(58) Field of Classification Search ............ 423/447.1, 423/447.2, 447.3, 445 R, 445 B, 460, 461; 516/32; 977/DIG. 1, 742, 745, 753, 845; 106/287.2, 287.21; 136/252
See application file for complete search history.

(56) References Cited

U.S. PATENT DOCUMENTS

| | | | |
|---|---|---|---|
| 5,505,879 A * | 4/1996 | Wang | ............................ 252/582 |
| 5,640,705 A | 6/1997 | Koruga | |
| 5,916,642 A | 6/1999 | Chang | |
| 5,985,112 A | 11/1999 | Fischer | |
| 6,019,656 A | 2/2000 | Park et al. | |
| 6,062,931 A | 5/2000 | Chuang et al. | |
| 6,087,765 A | 7/2000 | Coll et al. | |
| 6,090,363 A | 7/2000 | Green et al. | |
| 6,146,230 A | 11/2000 | Kim et al. | |
| 6,187,823 B1 * | 2/2001 | Haddon et al. | ................ 516/32 |
| 6,203,864 B1 | 3/2001 | Zhang et al. | |
| 6,231,744 B1 | 5/2001 | Ying et al. | |
| 6,232,706 B1 | 5/2001 | Dai et al. | |
| 6,239,547 B1 | 5/2001 | Uemura et al. | |
| 6,250,984 B1 | 6/2001 | Jin et al. | |
| 6,256,996 B1 | 7/2001 | Ghoshal | |
| 6,265,466 B1 | 7/2001 | Glatkowski et al. | |
| 6,277,318 B1 | 8/2001 | Bower et al. | |
| 6,361,861 B2 | 3/2002 | Gao et al. | |
| 6,362,011 B1 | 3/2002 | Massey et al. | |
| 6,783,746 B1 * | 8/2004 | Zhang et al. | ............ 423/447.1 |

OTHER PUBLICATIONS

Culotta, E., et al., "Buckyballs: Wide Open Playing Field for Chemists," Dec. 20, 1991, American Association for the Advancement of Science, Science, vol. 254, No. 5039, pp. 1706-1709.*
Hafner, J. H., et al., "From Fullerenes to Nanotubes," 1996, Kluwer Academic Publishers, The Chemical Physics of Fullerenes 10 (and 5) Years Later, pp. 19-26.*
Hamon, et al. Dissolution of Single-Walled Carbon Nanotubes. Advanced Materials. 11(10):834-840 (1999).
Chen, et al. Solution Properties of Single-Walled Carbon Nanotubes. Science 282:95-98 (1998).
Ausman, et al. Organic Solvent Dispersions of Single-Walled Carbon Nanotubes: Toward Solutions of Pristine Nanotubes. The Journal of Physical Chemistry. 104(38) 8911-8915 (2000).
Vigolo, et al. Macroscopic Fibers and Ribbons of Oriented Carbon Nanotubes. Science. 290:1331-1334 (2000).
Sun, et al. High Dissolution and Strong Light Emission of Carbon Nanotubes in Aromatic Amine Solvents. Journal of the American Chemical Society. 123:5348-5349 (2001).
Cochet, et al. Synthesis of a new polyaniline/nanotube composite: "in-situ" polymerisation and charge transfer through site-selective interaction. Chemical Communication. 16:1450-1451 (2001).
Ago, et al. Composites of Carbon Nanotubes and Conjugated Polymers for Photovoltaic Devices. Advanced Materials. 11(15):1281-1285 (1999).

* cited by examiner

*Primary Examiner*—Stuart Hendrickson
(74) *Attorney, Agent, or Firm*—Browdy and Neimark, PLLC

(57) ABSTRACT

High solubility of pristine single and multi-walled carbon nanotubes using electron donors as solubilizers has been observed. The resulting carbon nanotube solution can be readily diluted with other organic solvents, such as acetone, toluene and methanol. SEM after solvent evaporation clearly shows that nanotubes are still present after being subjected to this procedure. Electronic absorption of these solutions is observed in both the UV and visible region. Strong light emission (=0.30) was observed at 561 nm for dilute solutions of aniline-dissolved carbon nanotubes diluted with acetone.

12 Claims, 3 Drawing Sheets

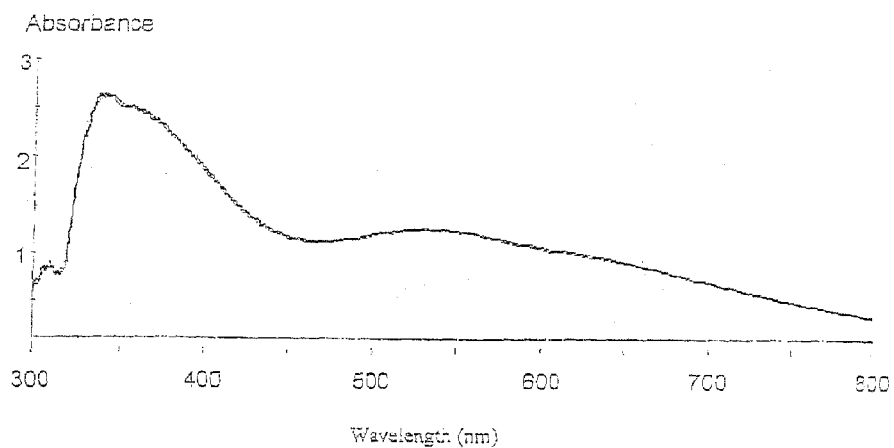
Figure 2a. UV-Vis absorption spectra of aniline dissolved carbon nanotubes solution.
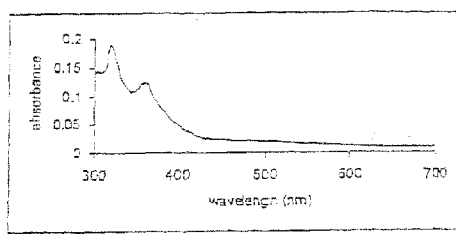
Figure 2b. Carbon nanotube aniline solution diluted in acetone.

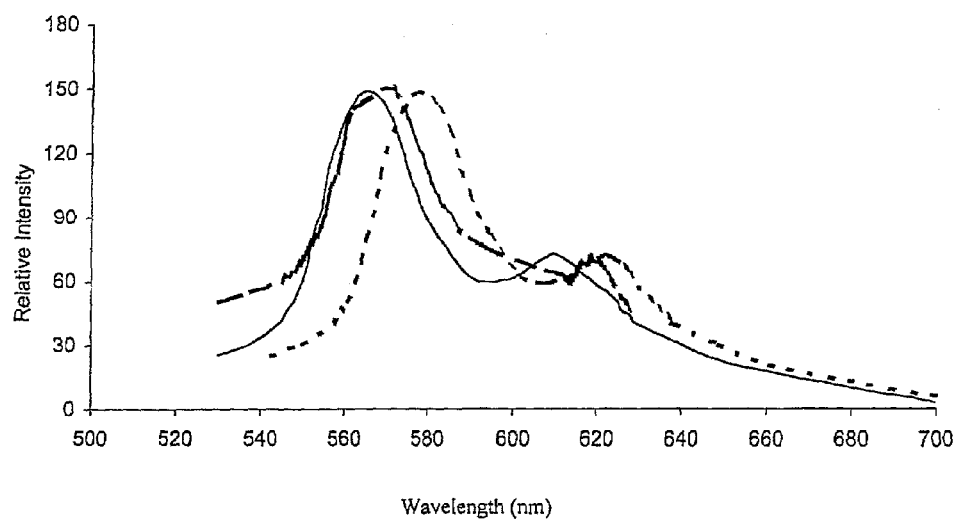
Figure 3. Emission spectra of aniline dissolved carbon nanotubes in different solvents.
In acetone ( —— ); in toluene ( -·-·· ); in methanol ( - - - ). All samples were excited at 500 nm.

METHOD FOR DISSOLVING NANOSTRUCTURAL MATERIALS

CROSS-REFERENCE TO RELATED APPLICATIONS

The present application claims priority under 35 U.S.C. §119(e) from U.S. provisional application 60/286,340, filed Apr. 26, 2001, the entire contents of which is hereby incorporated by reference.

FIELD OF THE INVENTION

The present invention provides a method for dissolving nanostructured materials such as carbon nanotubes and solutions for carbon nanotubes.

BACKGROUND OF THE INVENTION

Nanostructured materials, such as carbon nanotubes (NTs) have been the subject of much research in recent years because their unique electronic, mechanical and physical properties can be used in all areas of science.[1,2] Nanostructured tubes are becoming increasingly important because their mechanical properties, notably strength, stiffness, and toughness, make them useful in a variety of applications. Composites made from carbon nanotubes have superior strength and stiffness per weight, and thus are already being used in aerospace and sporting goods applications. Carbon nanotubes are also excellent electron emitters, emitting electrons at very low voltage, which makes them particularly useful in the field of flat panel displays. Their good electron conductivity and high thermal conductivity also make carbon nanotubes ideal materials for making anti-static and/or anti-corrosion coatings as well as thermal conductors. Additionally, carbon nanotubes can be used in electronic circuits where silicon and other standard semiconductor materials do not work.

Carbon nanotubes are particularly stable because of the strength with which the carbon atoms bond together. In nanotubes, the carbon atoms arrange themselves in hexagonal rings, similar to the arrangement in graphite. In fact, a nanotube resembles a sheet or several stacked sheets of graphite rolled into a seamless cylinder. Unfortunately, carbon nanotubes are difficult to dissolve or disperse in most organic or inorganic solvents because of their long structured features, large molecular size, or severe aggregation. The common agents used to help disperse carbon nanotubes are surfactants, which, however, can only increase the dispersibility to a limited extent, and surfactants do not affect the solubility of carbon nanotubes. Attaching alkyl groups to the surface of carbon nanotubes can increase their solubility to some extent. This approach, however, requires tedious chemical reactions, and the chemical functionalization may alter the structure or affect properties of the carbon nanotubes. In another approach, carbon nanotubes were wrapped with a helical polymer, through which they were brought into other solvents. This method, however, can only be applied in very limited circumstances. The size of soluble nanotubes depends upon the size of the helices of the polymer, and it is tedious to synthesize these polymers. This difficulty in dispersing or dissolving carbon nanotubes limits the ability to incorporate carbon nanotubes in other organic or inorganic materials as well as the ability to manipulate them chemically and characterize them quantitatively.

Some solution properties of carbon nanotubes have also been studied, aimed at their chemical modification and functionalization.[3-6] Several methods have been reported for making solubilized NTs, including attachment of long alkyl chains[3] and incorporation with polymers.[4,5] Haddon et al., in U.S. Pat. No. 6,187,823, disclose a method of dissolving single-walled nanotube carbons in organic solvents by directly functionalizing the nanotubes with amines or alkylaryl amines having an uninterrupted carbon chain of at least five and, more preferably, nine carbon atoms.

Despite those attempts, the dissolution of pristine carbon nanotubes, to our knowledge, has not been realized.

SUMMARY OF THE INVENTION

It is an object of the present invention to overcome the deficiencies in the prior art.

It is a further object of the present invention to provide a low cost, efficient way to solubilize nanotube materials.

It is another object of the present invention to provide solutions of nanotube materials in a variety of solvents.

It is another object of the present invention to make solutions of carbon nanotubes using a class of small organic molecules as dissolution or dispersing agents.

It is another object of the present invention to incorporate carbon nanotubes with organic polymers to make nanocomposites.

It is still another object of the present invention to provide enhanced light emission of LEDs.

It is a further object of the present invention to produce solar cells and magnetoelectric shielding using nanotubes.

It is yet another object of the present invention to make field emission devices using solubilized carbon nanotubes.

According to the present invention, nanotube materials can be dissolved in a variety of solvents by treating carbon nanotubes with an electron donor, such as an aromatic amine. The electron donor acts to solubilize the nanotubes in the solvents.

Once the carbon nanotubes are dissolved in these aromatic amines, the carbon nanotubes can be readily dissolved in other polar or nonpolar organic solvents, including but not limited to solvents such as chloroform, acetone, toluene, benzene, methanol, ethanol, DMF, TMF, and the like.

Dissolving carbon nanotubes in polar or nonpolar solvents using small electron donor molecules modifies the surface property of the carbon nanotubes and results in improved chemical interaction between modified nanotube and polymers, so that superior composite materials are produced.

BRIEF DESCRIPTION OF THE DRAWINGS

FIG. 2A shows the UV-visible absorption spectra of a solution of carbon nanotubes dissolved in aniline. FIG. 2B shows the absorbance of an aniline solution of carbon nanotubes diluted with acetone.

FIG. 3 shows the emission spectra of carbon nanotubes in aniline in different solvents.

DETAILED DESCRIPTION OF THE INVENTION

Figure 1:
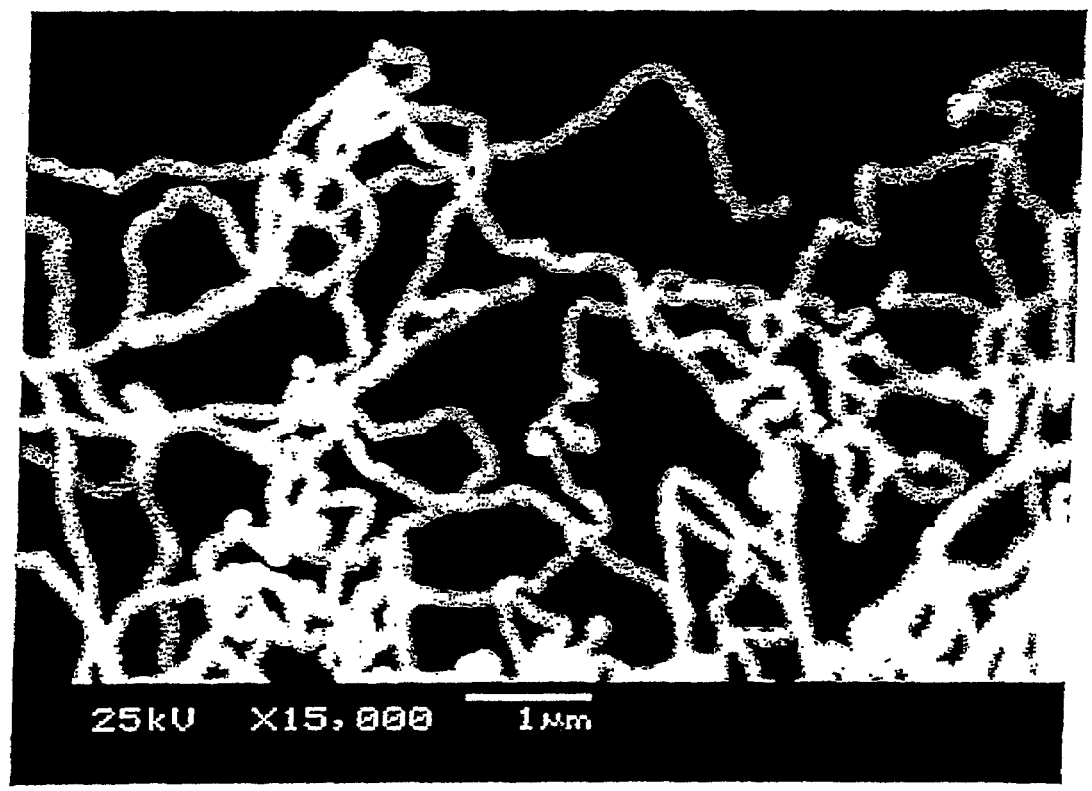
FIG. 1 is an SEM picture of dissolved carbon nanotubes after solvent evaporation.

Nanostructured materials such as carbon nanotubes can be dissolved in polar or nonpolar organic solvents using small electron donor molecules as solubilizers. Aromatic amines are among the preferred electron donor molecules. The nanostructured materials used can be nano carbon materials, such as carbon nanotubes, either single- or multi-walled, pristine or chemically functionalized.

The aromatic amine compounds which solubilize nanotubes comprise at least one amino group and at least one phenyl ring. The amino group can be a primary, secondary, or tertiary amino group. The phenyl ring can be substituted or substituted by other functional groups. Preferred substituents on the phenol ring are electron donor groups such as $C_1$-$C_{10}$ alkyl.

The preferred amines have the following structure:

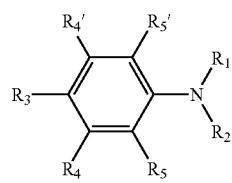

R=H, —$CH_3$, —$CH_2CH_3$, —h, —OH, —NH,
—SH, —NH2 etc wherein R can be hydrogen, $C_1$-$C_{10}$, phenyl, hydroxyl, primary or secondary amino, thio, etc. including —SH or—SR, wherein R is an aryl group; selino, either —SeH or —SeR, wherein R can be an aryl group. Additionally, any one of R can be selected from the following:

(Fused Aromatic Rings, Amine Groups Can be in Any Position.)

SCHEME 1

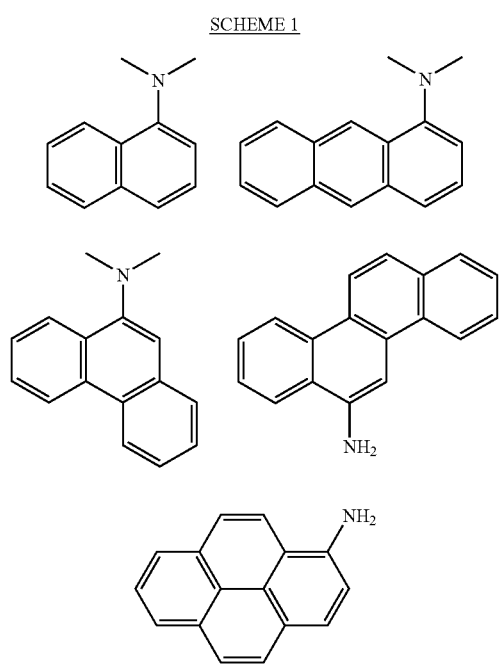

Alternatively, more than one amino group can be attached to the benzene ring, as illustrated by the following:

More than One Amine Groups, Amines Attached to Bezene Ring

SCHEME 2

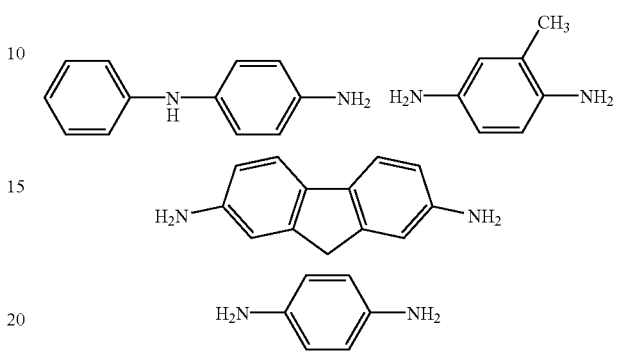

Other electron donors that can be used include N—substituted aromatic amines, wherein either one or two of the hydrogen on the ring is substituted by an aromatic group such as phenyl, or a $C_1$-$C_{12}$ alkyl group, either straight chain or branched, saturated or unsaturated. The following compounds illustrate such electron donors:

SCHEME 3

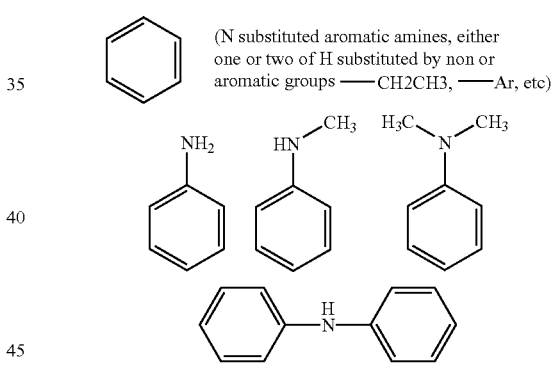

Additional compounds which can be used as electron donors to dissolve nanotubes include aromatic amines in which there is substitution in the benzene ring, alone or together with N substitution by aromatic or nonaromatic hydrocarbon groups. These hydrocarbon groups can have from 1 to 12 carbon atoms, and can be aryl, saturated, or unsaturated, branched chain or straight chain. Examples of these compounds are as follows:

SCHEME 4

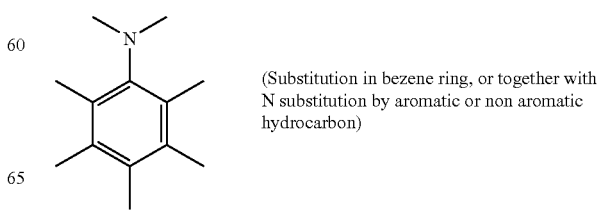

(Substitution in bezene ring, or together with N substitution by aromatic or non aromatic hydrocarbon)

-continued

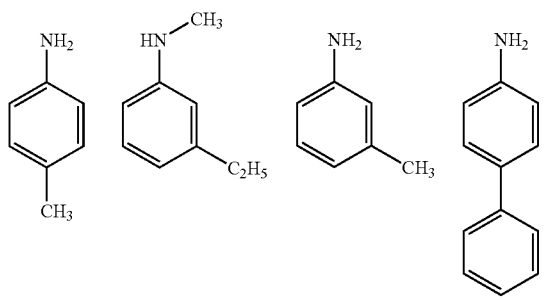

While the preferred solubilizing agents are amines, other solvents with different aromatic and heterocyclic ring structures may also function as electron donor solvents. The electron donors can be either in a solid or a liquid state.

The amine group can be attached to any type of heterocyclic aromatic ring, including fused rings with more than one heterocyclic atom, as illustrated by the following compounds:

Amine Group Attached to Heterocyce Aromatic Rings

SCHEME 5

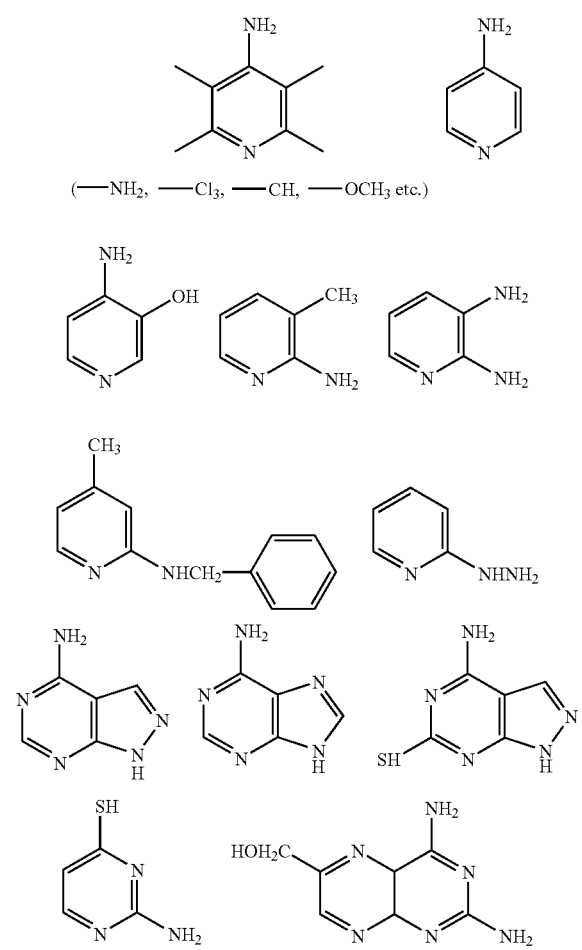

Substitution Contained Heterocycle Atoms (N, S, Se, O, etc.)

SCHEME 6

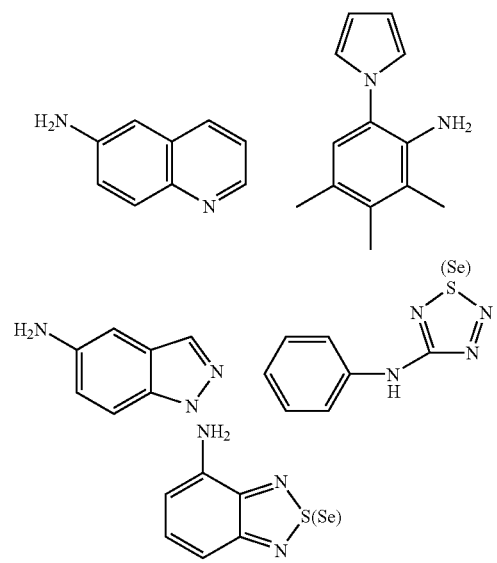

As noted above, the heterocycle atoms can be N, S, Se, O, or P.

The dissolution process can be facilitated significantly by applying an exogenous energy source to a mixture of carbon nanotubes and the electron donor compounds. The energy sources can include heating, mechanical stirring, ultra-sonification, microwave irradiation, or any combination thereof. The resulting solution can be mixed with polymers, for example, polyolifins such as polyethylene, polyvinyl chloride, polytetrafluoroethylene, polyacrylonitrile, polymethyl methacrylate, polyvinyl acetate, polyester, polystyrene, polyamide, and the like, to form nanocomposites. Alternatively, the solutions of nanotubes can be coated onto a substrate and the solvent removed by conventional means to form a coating or layer of nanotubes.

EXAMPLE 1

Purified single-walled carbon nanotubes (SWNT) were purchased from Rice University in toluene suspension. SWNTs were filtered through a 0.2 $_{13}$m PTFE filter membrane to produce so-called "bucky paper".[2] Multi-walled nanotubes were purchased from Nanocs Inc., New York. In one experiment, 40 mg of accurately weighed NTs were added to 5 mL aniline and the mixture was heated at reflux for 3 hours in the dark. Dissolution of carbon nanotubes in aniline was observed by the color change of the solution after reflux for a short time. Thus, with continuous heating, the original colorless aniline solution first became brownish and then turned dark red. After being cooled to room temperature, a NT solution was obtained by filtration through a 0.2 PTFE membrane. An SEM picture of carbon nanotubes dissolved in aniline (see FIG. 1) showed similar structural features to that before dissolution,[9] suggesting no damage had occurred to the NTs (of course, SEM would not reveal evidence of chemical reaction of the NTs). The solubility of SWNT in aniline is up to 8 mg/mL. This aniline-nanotube solution can be readily diluted with other organic solvents such as acetone, THF, and DMF.

EXAMPLE 2

2.5 grams of multi-walled carbon nanotubes were placed into a 100 mL flask. Then 25, mL of aniline was added, and the mixture was heated at reflux for two hours. The resulting brownish solution was filtered by 2 micrometer PTEE filter paper, and a clear solution was collected.

EXAMPLE 3

Carbon nanotubes from tubes from Rice University were dispersed in toluene and 10 mL of this dispersion was placed into a 100 mL flask. 20 mL of aniline was added, and the mixture was heated at reflux for two hours. The resulting browning solution was filtered through 2 micrometer PTEE filter paper, and the nanotube solution was collected.

EXAMPLE 4

2.5 grams of multi-walled carbon nanotubes were placed into a 100 mL flask. 25 mL of N,N-dimethyl aniline was added and the mixture was heated at reflux for two hours. The resulting solution was filtered through 2 micrometer PTEE filter paper, and the clear solution was collected.

EXAMPLE 5

2.5 grams of multi-walled carbon nanotubes were placed into a 100 mL flask. 25 mL of N,N-dimethyl aniline was added and the flask was irradiated by microwave radiation for five minutes. The resulting solution was filtered through 2 micrometer PTEE filter paper and the clear solution was filtered.

EXAMPLE 6

2 mL of the solution from Example 5 was diluted in 4 mL acetone. This solution was coated onto a glass surface by spin coating.

FIG. 1. SEM picture of dissolved carbon nanotubes (MWNT) after evaporation of aniline.

FIG. 2A shows the UV-Vis absorption spectra of the SWNT-aniline diluted with acetone solution. Absorption between 310-400 nm is very strong while a new peak at 530 nm suggests the formation of an aniline-SWNT charge-transfer complex. In very dilute solution, the broad peak between 310-400 nm can be resolved into two sharp peaks at 325 nm and 375 nm respectively, while the peak at 530 nm is no longer observed.

$C_{60}$ has been shown to form donor-acceptor complexes in the liquid state when dissolved in tertiary amines and substituted anilines. The room temperature solubility of $C_{60}$ in aniline, N-methylaniline, and N, N-dimethyl aniline was found to be 1.05, 1.16, and 3.89 mg/mL, respectively.[10-12] Complexation with aniline has also been applied to separate $C_{60}$ from various endohedral complexes.[13] $C_{60}$ also showed reactivity in the ground state with various primary, secondary and tertiary amines, attributed to electron transfer from the amines to the fullerene.[14] Because of its structural similarity to fullerenes, NT should be a good electron acceptor,[4,7] while aniline is a fairly good electron donor. At elevated temperatures, NT and aniline may form a charge transfer complex in its ground state, as evidenced by the appearance of new absorption in the visible region (FIG. 2). As in the interaction of primary and secondary amines with $C_{60}$,[14] this may be followed by proton transfer from aniline to the fullerene, (see Scheme 1). The NT-aniline complex (or adduct) is quite stable, even after three months, as shown by the persistence of the new spectral features. In contrast, no measurable dissolution of carbon nanotubes was observed in nitrobenzene, an electron acceptor. Solubilization was also observed between N,N-dimethylaniline(DMA) and NTs, but the process may not be the same as with aniline, since adduct formation by proton transfer between DMA and the NTs is not possible. The fluorescence spectrum of DMA-NT solutions is also much weaker than the NT-aniline solutions, indicating a different species is produced. The observation that dissolution of NTs in aniline requires higher temperatures than is needed for interaction of amines with fullerenes is reasonable considering not only the difference in molecular size, but also the fact that nanotubes have a very strong tendency to aggregate, which is one reason why they are insoluble in most common solvents.

Scheme 1. Proposed reaction mechanism between NTs and aromatic amines

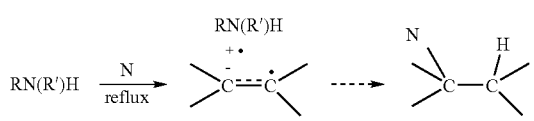

Scheme 1. Proposed Reaction Mechanism Between Aromatic Amine and Carbon Nanotubes FIG. 2. UV-Vis absorption spectra of SWNT-aniline solution.

Strong fluorescence was observed upon exciting the diluted SWNT-aniline solutions at 500 nm. FIG. 3 shows the emission spectra solutions in acetone, toluene and methanol, respectively. The maximum emission in acetone was observed at 565 nm with a shoulder at 610 nm. In methanol the emission is red-shifted by 20 nm with no change in intensity. The shift of the emission maximum in polar vs. nonpolar solvents is consistent with charge separation in the excited state. The fluorescence excitation spectra are quite different from the absorption spectra of the individual components, indicating the formation of a new light-absorbing species. The quantum yield of fluorescence of SWNT-aniline in acetone is 0.30,[18] considerably higher than that of aromatic molecules such as phenanthrene (0.10) and naphthalene (0.11), but similar to that of anthracene (0.29). Luminescence has been observed[4] at slightly longer wavelengths for polymer-bound (i.e., NTs covalently linked to poly-(propionylethylenimine-co-ethylenimine). The quantum yield for our NT-aniline solutions are also higher than that for the polymer-bound NTs.[4] As in the previous work, precautions were taken to prevent interference from fluorescence of small aromatic species and other impurities.[4]

As indicated above, it appears that a new chemical species is produced on heating SWNT in aniline, and that photoexcitation of this species leads to a luminescent charge separated state (exciplex). In polymer-bound carbon nanotubes, Riggs et al. rationalized that the luminescence might be due to the trapping of the excitation energy at defect sites.[4] Another factor that might enhance the fluorescence efficiency of nanotubes is their large molecular size, which would inhibit deactivation through molecular motion. In this respect, studies with purified NTs of different types and sizes would be informative. It is expected that there would also be differences in the fluorescence efficiency of zigzag, armchair, semiconducting, metallic and chiral carbon nanotubes.[1a]

To produce an improved luminescent material, a solution of carbon nanotubes and an electron donor compound is mixed with an appropriate fluorescent or luminescent polymer. For purposes of the present invention, a fluorescent substance is one that absorbs radiant energy of certain wavelengths and, after a fleeting instant, gives off part of the absorbed energy as quanta of longer wavelengths. Most fluorescent pigments are of the toluenesulfonamide-melamine-formaldehyde resin matrix type. A mixture of o- and p- toluenesulfonamide, paraformaldehdye, and a B-stage unmodified melamine-formaldehyde resin is heated together. Fluorescent dyes such as Rhodamine F3B, Rhodamine 6GDN, or Brilliant Yellow 6G Base are added along with a dispersion or solution of carbon nanotubes and an electron emitting molecule, and heating continued. The finished colored resin is clear, brittle, and friable, and can be pulverized by impact milling to a fine powder, which is the final fluorescent pigment which can be used in a wide variety of applications. The presence of the carbon nanotubes imparts superior fluorescence to the pigment. The use of the electron donor compound makes it possible to disperse the carbon nanotubes uniformly in the polymer composition so that a uniform pigment is produced.

FIG. 3. Emission spectra of SWNT-aniline in different solvents. Solid line: acetone; dashed line: toluene; dotted line: methanol. Excitation of all solutions at 500 nm.

The present invention provides a simple, economical way to disperse or dissolve nanotube materials in solvents so that the nanotube materials can be used in a variety of applications. The nanotubes in solution or dispersion form can be coated onto substrates or mixed into a variety of other materials, including polymers, to form composites with outstanding characteristics. For example, a high-current field emitter can be made by forming a dispersion of nanotubes as described in the above examples and mixing the dispersion into a composite paste with suitable polymeric resins. This paste is then smeared onto an electrode. When voltage is applied, some of the nanotubes in the layer point toward the opposite electrode and emit electrons. Composites of nanotubes are formed from producing a solution of nanotubes and coating this solution onto control electronics. Phophor-coated glass is placed on top to make a flat-panel display.

An electron emitter composition according to one embodiment of the present invention comprises carbon nanotubes as electron emitting materials. The composition also comprises a binder, dispersing agent, and water. The amount of the electron emitting material is preferably 1 to 50% by weight, more preferably 5 to 30% by weight, and most preferably 10 to 20% by weight, of the total composition.

To produce a field emission device using carbon nanotubes, nanotubes are dispersed in a dispersion agent such as polyoxyethylene nonyl phenyl ether derivative, polyvinylpyrrolidone, etc., with the aid of an electron donor molecule as described above. This mixture is then added to a binding composition, such as a silane based compound or colloidal silica, and the composition is bound to a cathode electrode made of silver, ITO, etc. Water can be used as the dispersion medium. Additional details of this production, with the exception of dispersion of the nanotubes with an electron donor molecule, can be found in Jin et al., U.S. Pat. No. 6,250,984, the entire contents of which are hereby incorporated by reference. The use of an electron donor compound to disperse the nanotubes provides improved dispersion so that a more uniform device can be prepared.

Additionally, nanotube solutions can be used for the formation of nano-composites or cast into thin films, which would solve the practical problems involved in making nanotube-based electronic and field emission display devices.[17] The strong fluorescence emission of carbon nanotubes should also be a useful probe in elucidation of the physical and biological properties of these materials. The process of the present invention makes it possible to manipulate nanotubes in order to produce desirable electronic and other types of devices. For example, when two slightly dissimilar nanotube molecules are joined together end to end, the "junction" between them functions as a diode. Diodes are the basis of receivers, which convert alternating current into direct current.

As more and smaller transistors are placed onto computer chips, the heat they generate could melt the silicon substrate. Nanotubes can be attached to chips to draw away heat, allowing them to run cooler. Additionally, as the transistors become smaller, so do the thin metal wires connecting them, making them more likely to break. Nanotubes can be used as replacement wires, as they are much stronger and thinner than metal wires.

Researchers at IBM have already used nanotubes to produce a transistor. Nanotubes can be formed from condensed carbon vapor, and they are only 1/50,000th as thick as a human hair. When the carbon rings of the nanotube line up with the main axis of the nanotube, the nanotube conducts electricity as well as a metal. When the pattern of hexagonal rings in a nanotube is twisted, the nanotube acts like a semiconductor, i.e., it conducts electricity only after a certain threshold. When two nanotubes, one a conductor and one semiconductor, are joined into one molecule, their junction acts like a diode, permitting electric current to flow in only one direction.

Nanotubes dissolved or dispersed with the aid of an electron donor molecule can readily be used to fabricate electron emitting sources such as described in Uemura et al., U.S. Pat. No. 6,239,547, the entire contents of which are hereby incorporated by reference. This electron emitting source is produced from carbon nanotubes formed from a columnar graphite layer in which a plurality of carbon nanotubes aggregate to form a needle-like structure. The electron-emitting source can be made by recessing a substrate and filling the recess with a solution or dispersion of carbon nanotubes which have been dissolved or dispersed with the aid of an electron donor molecule. Alternatively, a paste is formed by dispersing the carbon nanotubes in a conductive viscous solution with the aid or an electron donor molecule. This paste is used to form a pattern on a substrate. The use of the electron donor molecule makes it easy to disperse the nanotubes in the conductive solution so that the nanotubes are distributed evenly in the pattern.

Small amounts of nanotubes can be added to plastics to make the resin electrically conductive. Because the present invention makes it possible to dissolve or disperse nanotubes, the nanotubes can readily be evenly distributed throughout a resin composition. Alternatively, nanotubes can be incorporated into plastics to make them antistatic, or for use in EMI shielding. Nonlimiting examples of such polymers include epoxy resins, polyolefins, polyvinylchloride, polyacrylinitrile, polymethyl methacrylate, polyvinyl acetate, polyester, polystyrene, polyamide, and mixtures and copolymers thereof.

While nanotubes are about 100 times as strong as steel, they are too small to use as individual fibers. However, they can be assembled into bits of "rope". Being able to disperse the nanotubes evenly by the process of the present invention makes it much easier to assemble the nanotube "ropes."

Self-oriented bundles of carbon nanotubes, such as those disclosed in Dai et al., U.S. Pat. No. 6,232,706, the entire contents of which are hereby incorporated by reference, can be produced from carbon nanotubes which have been dispersed or dissolved in a fluid using an electron donor molecule. A silicon substrate is electrochemically etched to form a thin nanoporous layer on top of a macroporous layer. A dispersion or solution of carbon nanotubes with an electron donor molecule is deposited in a predetermined pattern on the substrate. This deposition is repeated until the carbon naotubes are deposited on the substrate in sufficient quantity to produce a superior field emission device.

As described above, the treated carbon nanotubes according to the present invention have much stronger light emission properties than untreated carbon nanotubes.

Nanotubes of differing sizes and configurations can be more easily separated after dissolution. The dissolved carbon nanotubes are applied to gel chromatography (gel permeation, affinity, or size exclusion) and eluted with different solvents. Because of the structural differences among different nanotubes, the ability to bind with the gel will differ, and the tubes can be washed out with common solvents.

Solutions of carbon nanotubes can be used to produce a variety of products incorporating carbon nanotubes as described above. In addition, solutions of carbon nanotubes can be used in making devices as described in the following U.S. patents, the entire contents of which are hereby incorporated by reference:

Koruga, U.S. Pat. No. 5,640,705
Chang, U.S. Pat. No. 5,916,642
Fischer, U.S. Pat. No. 5,985,112
Park, U.S. Pat. No. 6,019,656
Chuang et al., U.S. Pat. No. 6,062,931
Coll et al., U.S. Pat. No. 6,087,765
Green et al., U.S. Pat. No. 6,090,363
Jin et al., U.S. Pat. No. 6,146,230
Zhang et al., U.S. Pat. No. 6,203,864
Ying et al., U.S. Pat. No. 6,231,744
Uemura et al., U.S. Pat. No. 6,239,547
Ghoshal, U.S. Pat. No. 6,256,996
Glatkowski et al., U.S. Pat. No. 6,265,466
Bower et al., U.S. Pat. No. 6,277,318
Gao et al., U.S. Pat. No. 6,361,861
Massey et al., U.S. Pat. No. 6,362,011

Although dissolution of carbon nanotubes and study of their properties in solution has been a challenge for chemists, the present invention provides an improved way for dissolving and/or dispersing nanotube materials without the previously required cutting and chemical functionalization of carbon nanotubes, or attachment to polymers with solubilizing features.

The foregoing description of the specific embodiments will so fully reveal the general nature of the invention that others can, by applying current knowledge, readily modify and/or adapt for various applications such specific embodiments without departing from the generic concept, and, therefore, such adaptions and modifications should and are intended to be comprehended within the meaning and range of equivalents of the disclosed embodiments. It is to be understood that the phraseology or terminology employed herein is for the purpose of description and not of limitation.

REFERENCES (1) (a) .Yakobson, B. I.; Smalley, R. E. *Am. Sci.* 1997, 85, 324.

(b) Tans, S. J.; Devoret, M. H.; Dai, H.; Thess, A.; Smalley, R. E.; Geerligs, L. J.; Dekker, C. *Nature,* 1997 386, 474.

(c) Treacy, M. M. J.; Ebbesen, T. W.; Gibson, J. M. *Nature* 1996, 381, (d) Wong, E. W.; Sheehan, P. E.; Lieber, C. M. *Science* 1997, 277, 1971.

(e) Ebbesen, T. W. *Carbon Nanotubes: Preparation and Properties;* CRC Press: Boca Raton, Fla., 1997.

(f) Dresselhaus, M. S.; Dresselhaus, G.; Eklund, P. C. *Science of Fullerenes and Carbon Nanotubes;* Academic Press: New York, 1996.

(2) Liu, J.; Rinzler, A. G.; Dai, H.; Hafner, J. H.; Bradley, R. K.; Boul, P. J.; Lu, A.; Liverson, T.; Shelimov, K.; Huffman, C. B.; Rodriguez-Macias, F.; Shon, Y.-S.; Lee, T. R.; Colbert, D. T.; Smalley, R. E. *Science* 1998, 280, 1253.

(3) Chen, J.; Hamon, M. A.; Hu, H.; Chen, Y.; Rao, A. M.; Eklund, P. C.; Haddon, R. C. *Science,* 1998, 282, 95.

(41) (a) Riggs, J. E.; Guo, Z.; Carroll, D. L.; Sun, Y. P. *J. Am. Chem. Soc.* 2000, 122, 5879-5880.

(b) Sun, Y.-P.; Guduru, R.; Lawson, G. E.; Mullins, J. E.; Guo, Z.; Quinlan, J.; Bunker, C. E.; Gord, J. R. *J. Phys. Chem. B* 2000, 104, 4625.

(5) Tang, B. Z.; Xu, H. *Macromolecules* 1999, 32, 2569.

(6) Baran, P. S.; Khan, A. U.; Schuster, D. I.; Wilson, S. R. *Fullerene Sci. Technol,* 1999, 7, 921.

(7) Rao, A. M.; Eklund, P. C.; Bandow, S.; Thess, A. and Smalley, R. E. *Nature* 1997, 388, 257.

(8) Yudasaka, M.; Zhang, M.; Jabs, C.; Iijima, S. *Appl. Phys. A* 2000, 71, 449.

(9) See original SEM picture of SWNT at http://cnst.rice.edu

(10) Allemand, P. M.; Khemani, K. C.; Koch, A.; Wudl, F.; Holczer, K.; Donovan, A.; Gruner, G.; Thompson, J. D. *J. Am. Chem. Soc.* 1991, 113, 1050.

(11) Sension, R. J.; Azarka, A. Z.; Smith, G. R.; Hochstrasser, R. M. *Chem. Phys. Lett.* 1991, 185, 179.

(12) Wang, Y. *J. Phys. Chem.* 1992, 96, 764-767

(13) Kubozono, Y.; Maceda, H.; Yakebayashi, Y; Hiraoka, K.; Nakai, T.; Kashino, S.; Ukita, S.; Sogabe, T. *J. Am. Chem. Soc.* 1996, 118, 6998.

(14) Hirsch, A.; Li, Q. Y.; Wudl, F. *Angew. Chew. Int. Ed. Engl.* 1991, 30, 1309.

(15) Curran, S.; Ajayan, P.; Blau, W. J.; Carroll, D. L.; Coleman, J. N.; Dalton, A. B.; Davey, A. P.; Drury, A.; McCarthy, B.; S. S. Maier, S. S. *Adv. Mater.* 1998, 10, 1091.

(16) Vivien, L.; Anglaret, E.; Riehl, D.; Bacou, F.; Journet, C.; Goze, C.; Andrieux, M.; Brunet, M.; Lafonata, F.; Vernier P.; Hache, F. *Chem. Phys. Lett.* 1999, 307, 317-319.

(17) Kazaoui, S.; Minami, N.; Jacquemin R. *Phys. Rev. B* 1999, 60, 339-342.

(18) Quinidine sulfate was used as the standard for measurement of fluorescence quantum yields.

What is claimed is:

1. A method for dissolving or dispersing pristine nanotubes in solvents consisting of mixing the nanotubes with an electron donor compound as a solubilizer, wherein the electron donor compound is selected from the group consisting of:

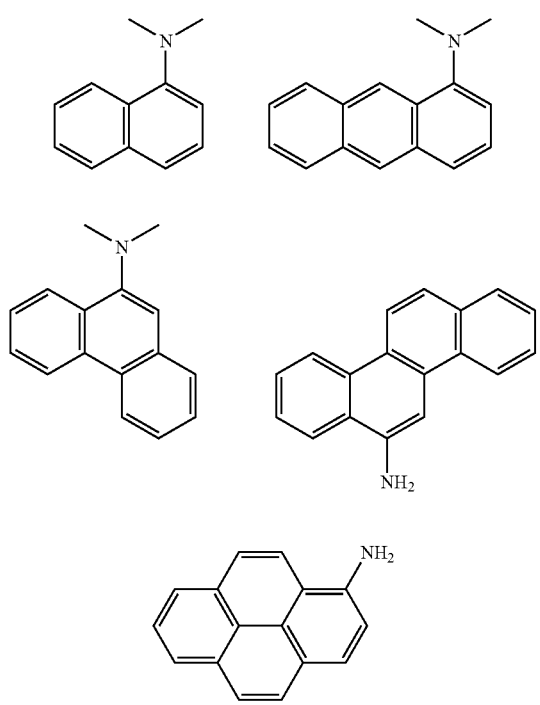
wherein the amino group can be in any position on the fused ring system,
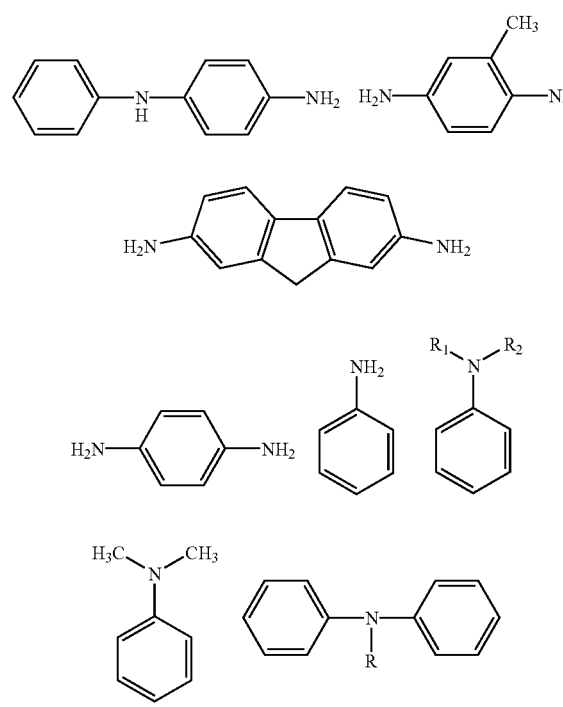
wherein $R_1$, $R_2$ are each selected from the group consisting of hydrogen, $C_1$-$C_{12}$ alkyl, and $C_6$-$C_{12}$ aryl;
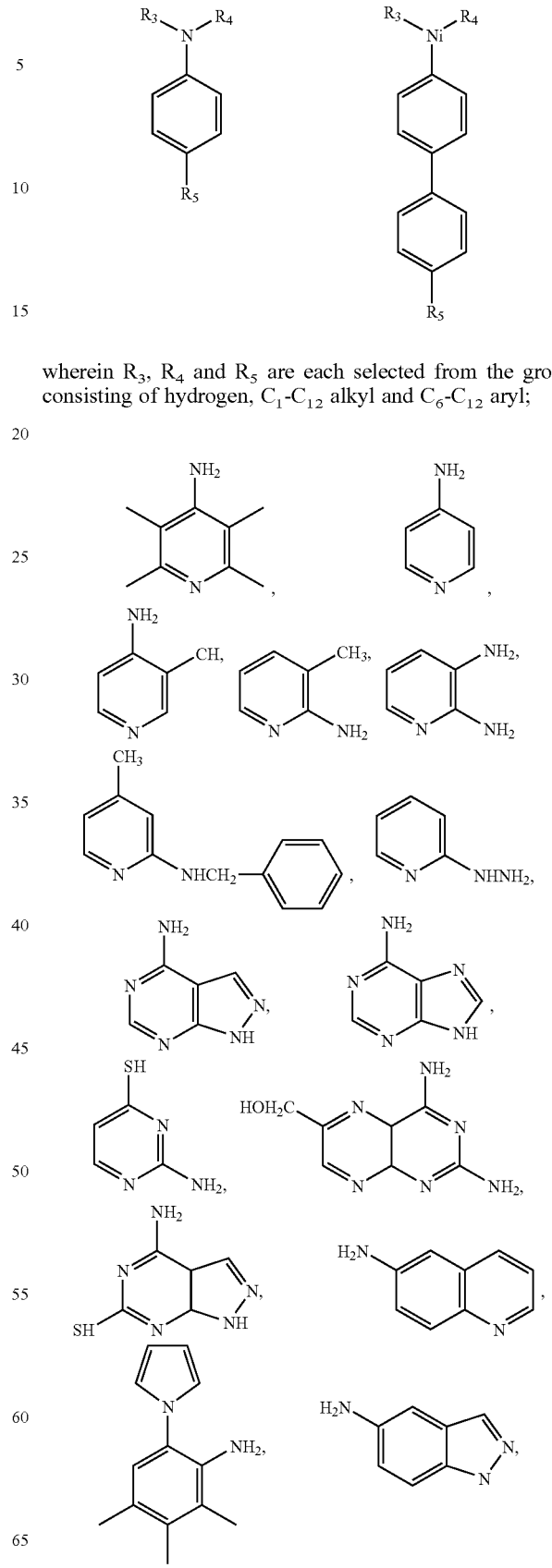
wherein $R_3$, $R_4$ and $R_5$ are each selected from the group consisting of hydrogen, $C_1$-$C_{12}$ alkyl and $C_6$-$C_{12}$ aryl;

-continued

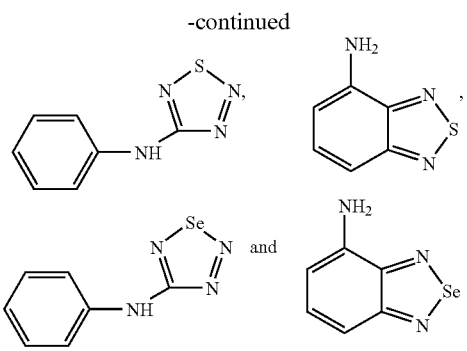

2. The method according to claim 1 wherein the nanotubes do not react with the electron donor compounds.

3. The method according to claim 1 wherein the electron donor compound is an aromatic amine of the following formula:

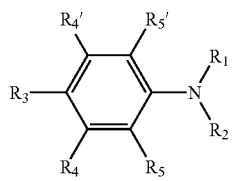

R=H, —CH$_3$, —CH$_2$CH$_3$, —ph, —OH, —NH, —SH, —NH$_2$.

4. The method according to claim 1 wherein the electron donor compound is selected from the group consisting of compounds of the formula:

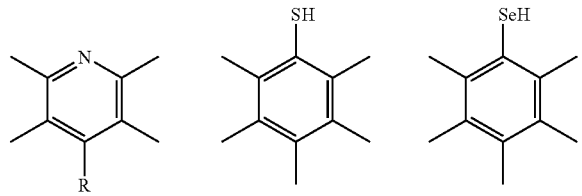

wherein R is selected from the group consisting of H, OH, C$_1$-C$_{12}$ alkyl and C$_6$-C$_{12}$ aryl.

5. The method according to claim 1 wherein the solvents are polar or nonpolar.

6. The method according to claim 1 wherein an exogenous energy source is applied to the mixture of nanotutes and electron donor compound.

7. The method according to claim 6 wherein the exogenous energy source is selected from the group consisting of heat, radiation, and sonification.

8. The method according to claim 1 wherein the nanotubes are selected from the group consisting of single walled nanotubes and multi-walled nanotubes.

9. In a method for producing solar cells from nanotubes, the improvement comprising dissolving the nantotubes in an electron donor compound according to claim 1 prior to assembling the solar cell.

10. A solution of pristine nanotubes in a solvent plus an electron donor, wherein the electron donor compound is selected from the group consisting of: is selected from the group consisting of:

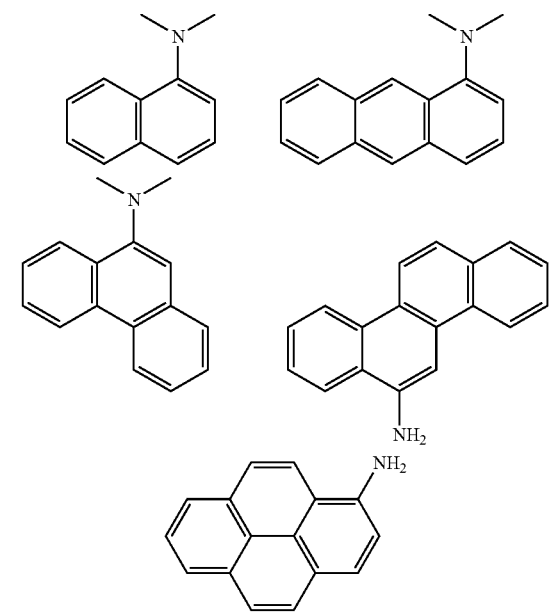

wherein the amino group can be in any position on the fused ring system,

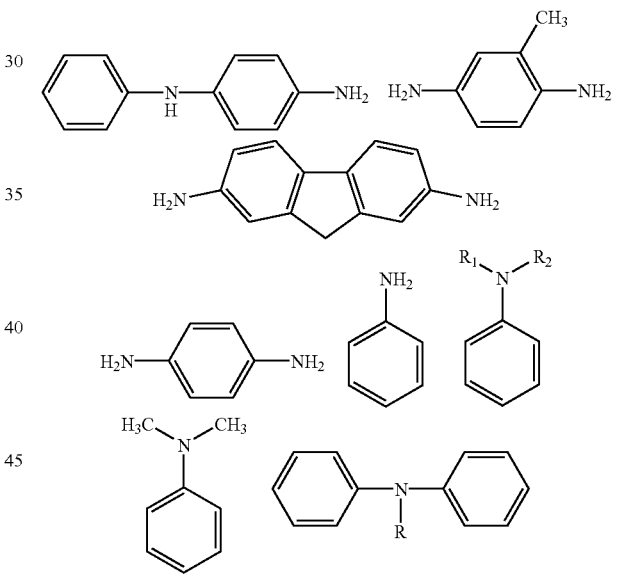

wherein R$_1$ R$_2$ are each selected from the group consisting of hydrogen, C$_1$-C$_{12}$ alkyl, and C$_6$-C$_{12}$ aryl;

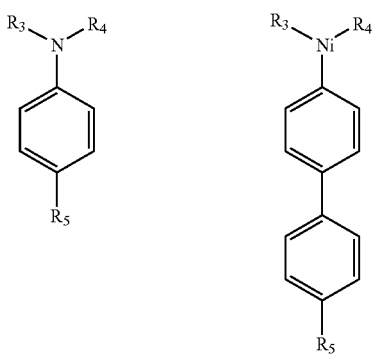

wherein $R_3$, $R_4$ and $R_5$ are each selected from the group consisting of hydrogen, $C_1$-$C_{12}$ alkyl and $C_6$-$C_{12}$ aryl;

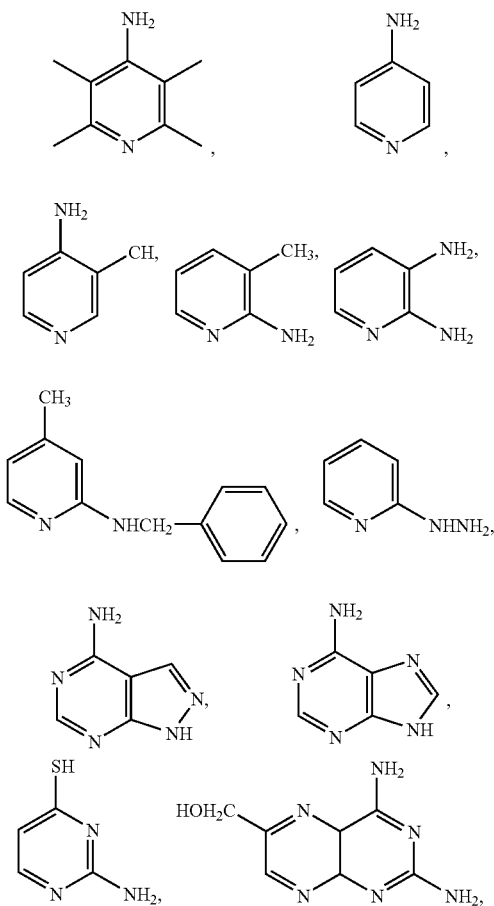

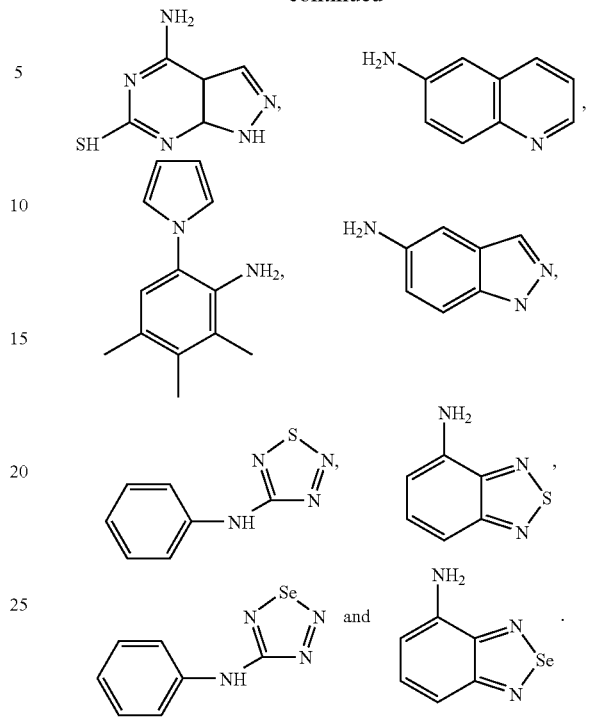

11. The solution according to claim 10 wherein the solvent is selected from the group consisting of polar solvents and nonpolar solvents.

12. The solution according to claim 10 wherein the nanotubes are selected from the group consisting of single walled nanotubes and multi-walled nanotubes.

* * * * *